United States Patent
Venditti et al.

(10) Patent No.: US 9,667,281 B1
(45) Date of Patent: May 30, 2017

(54) TRANSMITTER DATA PATH SINGLE-ENDED DUTY CYCLE CORRECTION FOR EMI REDUCTION

(71) Applicant: Microsemi Storage Solutions (U.S.), Inc., Aliso Viejo, CA (US)

(72) Inventors: Michael Ben Venditti, Montreal (CA); Vadim Milirud, Vancouver (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 0 days.

(21) Appl. No.: 14/727,996

(22) Filed: Jun. 2, 2015

Related U.S. Application Data

(63) Continuation of application No. 13/873,875, filed on Apr. 30, 2013, now Pat. No. 9,071,293.

(60) Provisional application No. 61/640,380, filed on Apr. 30, 2012.

(51) Int. Cl.
*H04K 1/02* (2006.01)
*H04L 25/03* (2006.01)
*H04L 25/49* (2006.01)
*H04B 1/04* (2006.01)

(52) U.S. Cl.
CPC .................. *H04B 1/0475* (2013.01)

(58) Field of Classification Search
None
See application file for complete search history.

(56) References Cited

U.S. PATENT DOCUMENTS

| | | | |
|---|---|---|---|
| 6,188,264 B1 * | 2/2001 | Masuta | H03K 5/084 327/316 |
| 7,352,204 B2 | 4/2008 | Frisch | |
| 7,501,851 B2 | 3/2009 | Venditti et al. | |
| 7,650,526 B2 | 1/2010 | Alon et al. | |
| 8,004,330 B1 | 8/2011 | Acimovic et al. | |
| 2002/0118036 A1 * | 8/2002 | Simon | G06F 1/08 326/29 |
| 2006/0256880 A1 * | 11/2006 | Frisch | G01R 31/31706 375/257 |

(Continued)

OTHER PUBLICATIONS

U.S. Appl. No. 13/873,875, Office Action dated Dec. 12, 2014.
(Continued)

*Primary Examiner* — Wednel Cadeau
(74) *Attorney, Agent, or Firm* — Dennis R. Haszko

(57) ABSTRACT

The present disclosure provides a means to adjust the relative location of output rising and falling transitions to reduce single-ended duty cycle distortion (DCD) effects in the output data stream originating from the transmitter data path. This serves to improve high-speed single-ended signal characteristics and reduce electromagnetic interference (EMI). Another feature enabled by embodiments of the present disclosure is polarity skew (also referred to as differential skew) reduction between transmitter outputs. In an embodiment, the disclosed method and apparatus for transmitter data path single-ended DCD correction describes a closed-loop calibration system including the actuation apparatus within the transmitter, a sensing block at the output of the transmitter to measure the amount of single-ended DCD, and a calibration block operating on the sensor output to devise correction control inputs to the actuator in the transmitter to correct the data path single-ended DCD present.

18 Claims, 13 Drawing Sheets

(56) References Cited

U.S. PATENT DOCUMENTS

| | | | |
|---|---|---|---|
| 2007/0285120 A1* | 12/2007 | Venditti | H03K 19/01758 |
| | | | 326/30 |
| 2009/0243682 A1* | 10/2009 | Huang | H04L 25/0272 |
| | | | 327/170 |
| 2011/0304371 A1* | 12/2011 | Ravi | G06F 1/10 |
| | | | 327/175 |
| 2012/0020077 A1 | 1/2012 | Chang | |
| 2012/0200277 A1* | 8/2012 | Silva | G01R 19/003 |
| | | | 323/284 |

OTHER PUBLICATIONS

U.S. Appl. No. 13/873,875, Office Action dated Jul. 3, 2014.
U.S. Appl. No. 13/873,875, Notice of Allowance dated Feb. 27, 2015.

* cited by examiner

TRANSMITTER DATA PATH SINGLE-ENDED DUTY CYCLE CORRECTION FOR EMI REDUCTION

CROSS REFERENCE TO RELATED APPLICATIONS

This application is a continuation of U.S. patent application Ser. No. 13/873,875, filed Apr. 30, 2013, which claims the benefit of priority of U.S. Provisional Patent Application No. 61/640,380, filed Apr. 30, 2012, both of which are incorporated herein by reference.

FIELD

The embodiments described herein are primarily applicable to the field of transmitter/driver designs intended to drive signals off-chip. More particularly, the embodiments described herein relate to data path single ended DCD and skew correction for transmitters.

BACKGROUND

In traditional transmit path serialization, the serialization is achieved through a dedicated PISO (parallel-in, serial-out) circuit, and is then followed by the output driver (conventionally referred to as the transmitter).

The PISO circuit employs a mix of sequential and combinational circuit elements to take a parallel input data bus at a lower data rate and produce a serial output signal at a higher data rate. In certain applications, the PISO will also provide additional serial output signals for the transmitter to implement one or more taps of pre- and/or post-cursor emphasis.

The above information is presented as background information only to assist with an understanding of the present disclosure. No determination has been made, and no assertion is made, as to whether any of the above might be applicable as prior art with regard to the present invention.

SUMMARY

In a first aspect, the present disclosure provides an circuit for improving signal integrity characteristics of a transmitter, the circuit comprising: an actuator block configured to adjust an output of the transmitter; a sensing block configured to sense a characteristic of the output signal of the transmitter; and a calibration block configured to provide a control signal to the actuator based on the sensed characteristic of the output signal.

In various embodiments, the output signal is a differential signal; and wherein the sensing block is configured to sense a difference between a positive signal and a negative signal of the differential signal.

In some embodiments, the circuit further comprises a comparison block configured to: generate a digitized signal based on the sensed characteristic; and provide the digitized signal to the calibration block. In some such embodiments, the comparison block comprises: a comparator; a limiting amplifier; and a flip-flop.

In some embodiments, the sensing block is configured to sense single-ended duty cycle distortion (DCD) in the output signal. In some embodiments, the sensing block is configured to sense polarity skew in the output signal. In various embodiments, the sensing block is configured to sense both DCD and polarity skew in the output signal.

In various embodiments, the sensing block comprises an RC filter.

In some embodiments, the sensing block comprises: a plurality of different types of sensors; and at least one switch for selecting between the plurality of different types of sensors.

In some embodiments, the actuator block is configured to delay transitions of the output signal. In some embodiments, the actuator block is configured to advance transitions of the output signal.

In various embodiments, the actuator block is configured to delay transition of a leading signal of the differential signal and advance transitions of a lagging signal of the differential signal.

In some embodiments, the actuator block comprises an actuator having a current starved inverter.

In various embodiments, the actuator block comprises a plurality of parallel current starved inverters.

In some embodiments, the current starved inverter comprises an input for receiving an analog control signal. In some embodiments, the current starved inverter comprises an input for receiving an digital control signal.

Other aspects and features of the present disclosure will become apparent to those ordinarily skilled in the art upon review of the following description of specific embodiments in conjunction with the accompanying figures.

BRIEF DESCRIPTION OF DRAWINGS

Embodiments of the present disclosure will now be described, by way of example only, with reference to the attached Figures.

DETAILED DESCRIPTION

Figure 1:
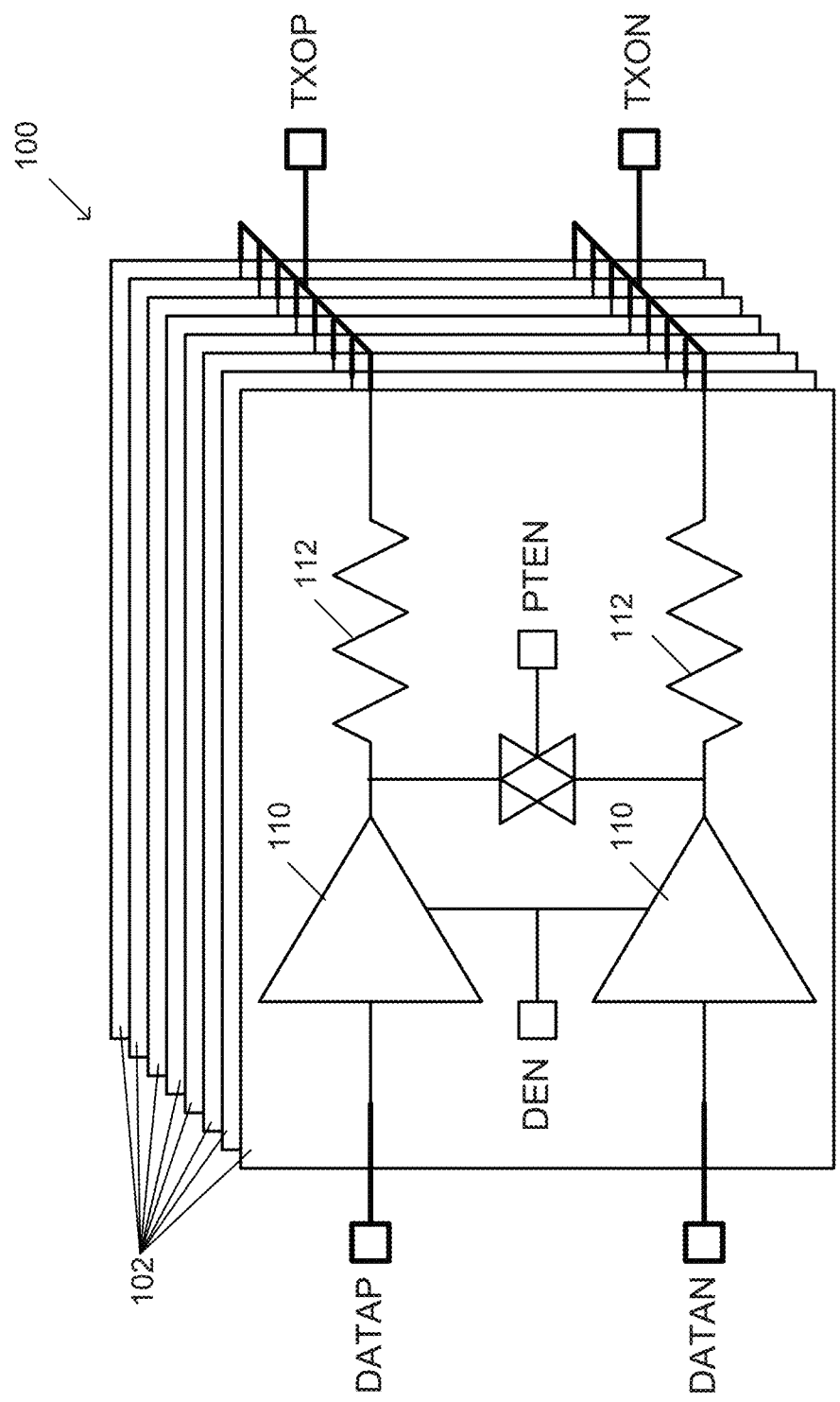
FIG. 1 illustrates a generic voltage-mode transmitter.

Embodiments of the present disclosure describe a method and apparatus to adjust the relative location of output rising and falling transitions of a transmitter for the purposes of reducing single-ended duty cycle distortion (DCD) effects in the output data stream originating from the transmitter data path. This serves to improve high-speed single-ended signal characteristics, such as for example but not limited to jitter reduction, and reduce electromagnetic interference (EMI). Another feature enabled by some embodiments disclosed herein is polarity skew (also referred to as differential skew) reduction between the single-ended transmitter outputs.

Some embodiments of the present disclosure are also applicable to single-ended transmission applications where it is desired to improve high-speed single-ended signal characteristics (e.g. jitter reduction).

The method and apparatus according to embodiments describe a closed-loop calibration system including the actuator block within the transmitter, a sensing block at the output of the transmitter to measure the amount of single-ended DCD, and a calibration block operating on the sensor output to devise correction control inputs to the actuator block in the transmitter to correct the data path single-ended DCD present.

Some embodiments of methods and apparatuses disclosed herein enable skew between differential transmitter output polarities to be reduced.

In an embodiment, the actuator block includes a pair of current-starved inverters that drive the pull-up and pull-down path devices in the transmitter output driver. Each current-starved inverter has control of its pull-up path current source and pull-down current source. This arrangement permits the location of rising and falling transitions at the output of the output driver to be controlled independently.

In an embodiment, the sensing block described in this disclosure measures the average value of a quantity related to the transmitter output signals TXOP and TXON. This could be the average of the common-mode signal (TXOP+TXON)/2, or the average of TXOP and/or TXON directly. The sensing block further compares the measured quantity against a reference voltage using a comparator. When single-ended DCD is not present on TXOP and TXON, the common-mode voltage is typically close to half of the supply voltage VDD. Thus, the reference voltage could be VDD/2, or it may be set to another voltage [via a digital to analog converter (DAC), for example] to compensate for other effects such as leakage, random offsets, etc. . . . . The output of the sensing block is a signal that indicates if the clock has a too-low duty cycle ("1" pulses narrower than "0" pulses) or a too-high duty cycle ("1" pulses wider than "0" pulses). The sensor would be made to operate on one or both clock polarities.

In an embodiment, the calibration block takes the digital output of the sensing block and determines an appropriate control signal modification to the actuation apparatus. The control signal modification serves to adjust the degree of starving in the current-starved inverters to adjust the duty cycle on TXOP and TXON to minimize the DCD.

Various embodiments disclosed herein can be applied in a differential high-speed transmitter (several or tens of Gb/s) used in a transmission line and/or backplane environment (e.g. SAS, SATA, PCI Express, Ethernet 10G Base-KR, E/GPON, etc. . . . ). Such transmitters may include a PISO architecture. Some embodiments disclosed herein can be applied in a lower-speed single-ended or differential transmitter for specifications like DDR.

The transmitter takes the PISO output and drives it external to the chip, while providing conventional features to control the output waveform characteristics (e.g. amplitude control, impedance control, edge-rate control, pre-/post-cursor emphasis, etc. . . . ). The fundamental operations of the transmitter are implemented using combinational or analog circuit elements. A voltage-mode transmitter is constructed from conventional CMOS or CMOS-like structures. A current-mode transmitter employs an output stage based on, for example, a current-mode logic (CML) or a low-voltage differential signaling (LVDS) structure, and employs pre-driver stages constructed from CML- or LVDS-like structures or from conventional CMOS structures.

For transmitters that employ pre-driver elements based on conventional CMOS or CMOS-like structures, the data path leading to the final output driver will experience rise and fall time mismatch and effective low→high and high→low transition propagation delay variation as a function of process, voltage and temperature operating conditions.

Figure 2:
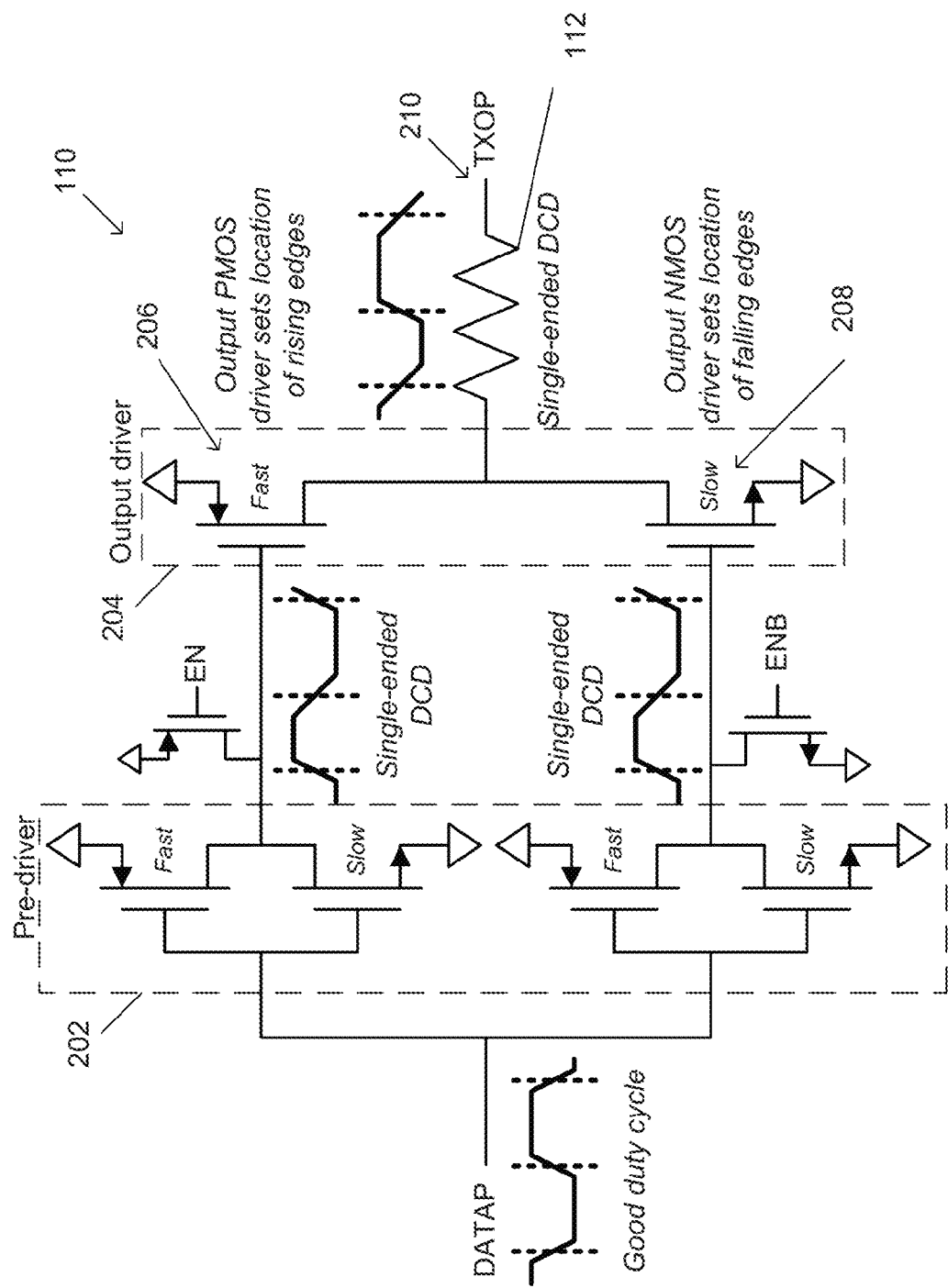
FIG. 2 illustrates a single-ended DCD generation in a voltage mode transmitter.

Consider, for example, a voltage mode transmitter such as that shown in FIG. 1, in which the driver 100 consists of multiple unit cells 102 with CMOS inverter-like output drivers 110 driving series resistances 112. A representative portion of a unit cell 102 is shown in FIG. 2, only the positive polarity data path is shown for simplicity. Suppose the input is ideal with equal rise and fall times and no single-ended DCD effects, and consider the scenario where a chip has relatively faster PMOS devices and relatively slower NMOS devices. It should be understood that FIG. 2 illustrates DCD generated in the data path of the transmitter or in other words, DCD that is generated after the serializer.

At the pre-driver stage 202 output, rising edges are faster than falling edges, and the location of the rising and falling transitions (mid-rail crossing points) exhibit single-ended DCD effects. The pre-driver 202 outputs are input to the output driver 204 stage, where the PMOS device 206 primarily influences the location of the output rising edges, and the NMOS 208 device primarily influences the location of the output falling edges.

The transmitter output TXOP 210 similarly exhibits a mismatch in rise and fall times and the location of the rising and falling transitions (mid-rail crossing points) exhibit single-ended DCD effects. The characteristics on the opposite transmitter output polarity TXON will be similar but opposite. A "0" (or "1") pulse that is widened (or shrunk) on TXOP will be matched with a "1" (or "0") pulse that is shrunk (or widened) on TXON, with the result that the net differential signal TXOP-TXON exhibits no duty cycle impairment.

In chains of real CMOS inverter and CMOS inverter-like constructs, the effects of rise/fall time-induced DCD effects introduced by one stage tend to be dampened by the corresponding effects of a second stage. In the example illustrated by FIG. 2, this effect is not considered in any accurate fashion for the purposes of illustrating how single-ended DCD effects are generated and propagate.

Even if techniques were used at the composite transmitter level to equalize rise and fall times at the transmitter output, the errors in rising and falling transition locations would remain from the pre-driver, and the transmitter would still exhibit single-ended DCD and no differential DCD impairment.

Figure 3:
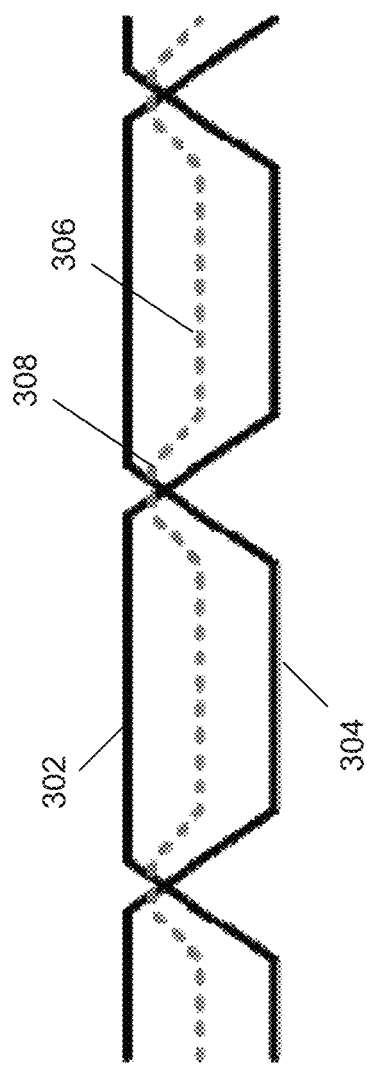
FIG. 3 illustrates a single-ended DCD causing common-mode spikes.

The consequence of having single-ended DCD on the single-ended outputs of the transmitter is to generate spurs on the common mode signal (TXOP+TXON)/2, as illustrated in FIG. 3 where the solid traces 302 and 304 represent the single-ended components of the differential transmitter output with single-ended DCD characteristics, and the dashed trace 306 represents the impact in the form of spikes 308 (which may also be referred to as spurs) on the common mode signal. These common-mode spurs 308 are a strong source of EMI.

Transmitter Data Path Single-Ended Duty Cycle Correction for EMI Reduction

Actuator Unit Cell

Figure 4:
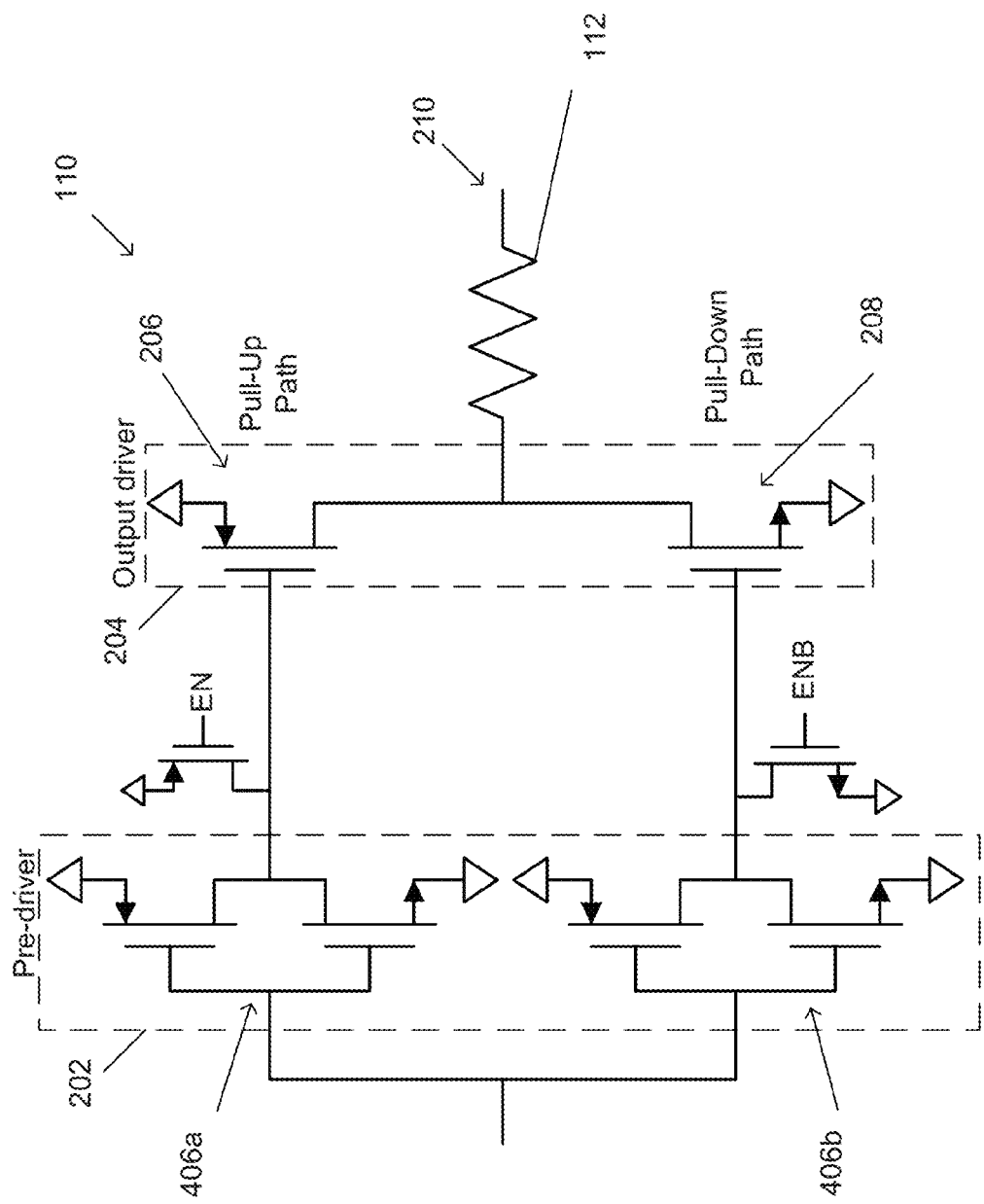
FIG. 4 illustrates a conventional voltage mode unit cell.

A high-speed serial transmitter that employs a known voltage-mode architecture is constructed from a number (N) of unit drive cells with their outputs connected in parallel. This is illustrated in FIG. 1. Each output driver is conventionally driven by a CMOS inverter pre-driver 202, as illustrated in FIG. 4. FIG. 4 is similar to FIG. 2 but omits the signal illustrations for purposes of clarity. Pre-driver 202 comprises inverters 406a and 406b.

Figure 5:
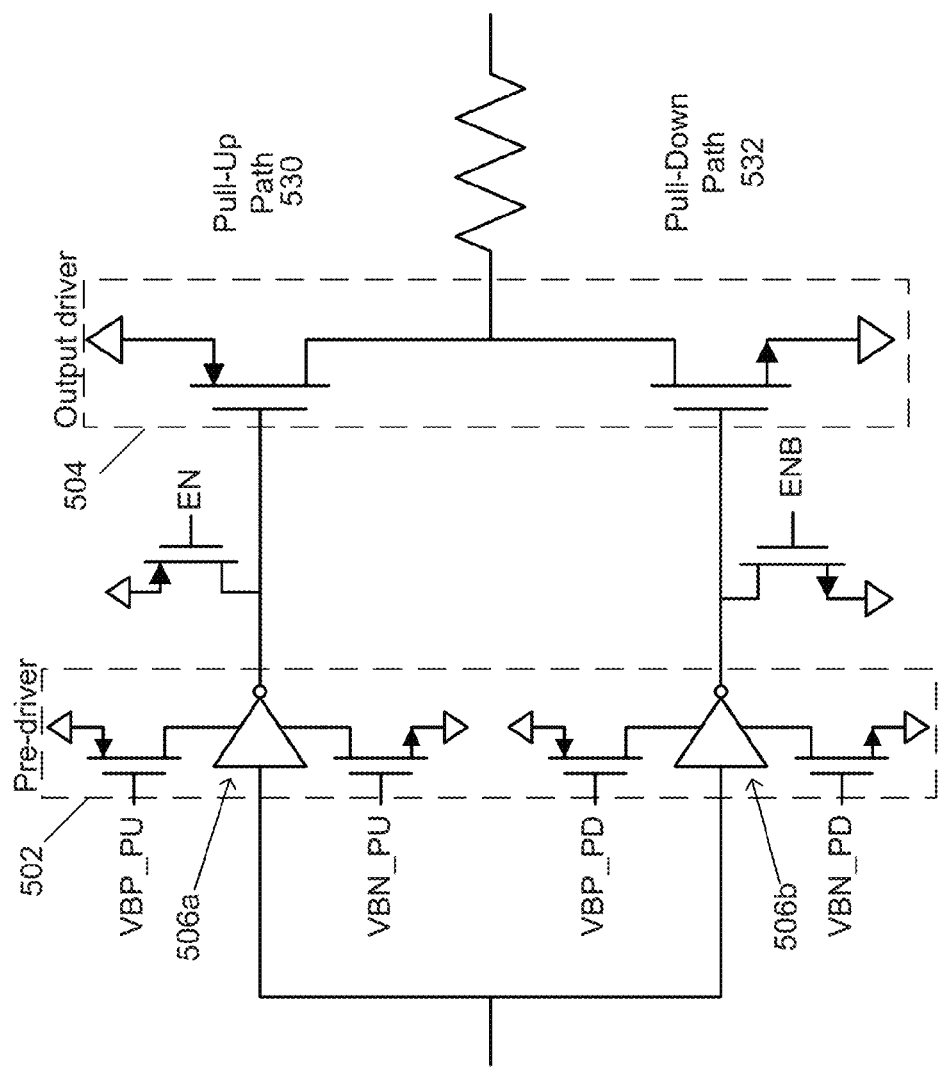
FIG. 5 illustrates a voltage mode unit cell of an embodiment of the present disclosure.

Embodiments of the present disclosure replace the CMOS inverter pre-driver from FIG. 4 with current-starved inverters, as shown in FIG. 5. Pre-driver 502 includes current-starved inverters 506a and 506b. The VBP and VBN bias voltages on the pull-up (PU) path 530 and the pull-down (PD) path 532 are continuous or quasi-continuous analog voltages. Each of the bias voltages can be set exclusively to an appropriate supply voltage for crude on/off control, or one of the pair of voltages or both of them may be set to an intermediate voltage (e.g. through the use of a programmable DAC or an analog filter) for finer control of the pre-driver strength.

In various embodiments, the tail transistors may be of identical size (thermometer control code), they may be binary weighted (binary control code), or some combination/variation thereof.

Alternative Actuator Unit Cell

Figure 6:
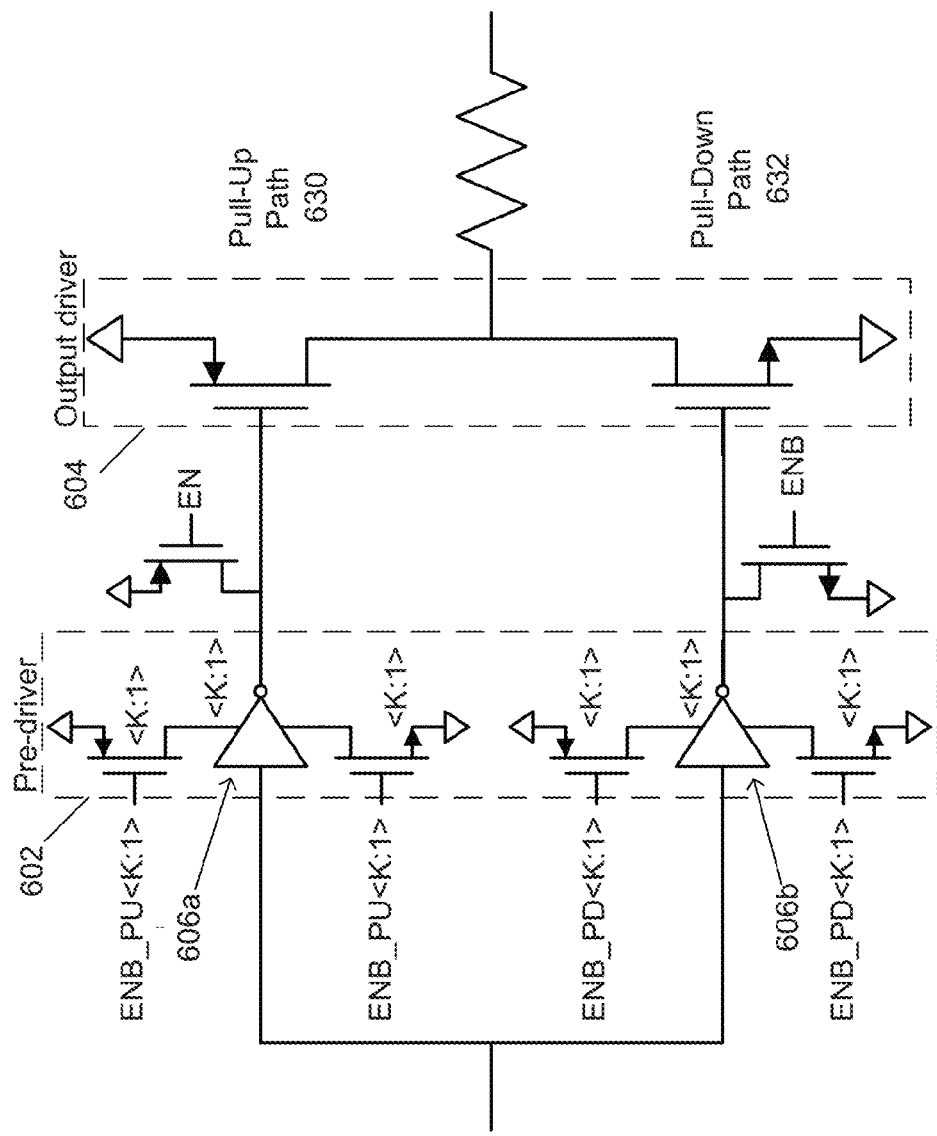
FIG. 6 illustrates a alternate voltage mode unit cell of an embodiment of the present disclosure.

The pre-driver may alternately be arranged as a number (K) of parallel current-starved inverters with crude on/off control for each component inverter, as illustrated in FIG. 6. The first group of K inverters, which is in the pull-up path, generally designated as 606a and the second group of K inverters, which is in the pull-down path, is generally designated as 606b. The EN_PU/ENB_PU and EN_PD/ENB_PD control inputs to each parallel current-starved inverter may be set to an appropriate supply voltage for crude on/off control. The embodiment illustrated in FIG. 6 provides similar functionality as the unit cell of FIG. 5. However, depending on the number of inverters in each group 606a and 606b, the embodiment of FIG. 6 may have cruder control granularity than the embodiment of FIG. 5. Analogous approaches to correcting single-ended DCD as described for the unit cell of FIG. 5 are applicable to the unit cell structure of FIG. 6.

As with the other pre-driver arrangement, it can be configured at the composite transmitter level such that all unit cells in the transmitter employ single-ended DCD correction approach simultaneously. It can also be configured such that a subset of the K total unit cells have single-ended DCD correction applied, with the remainder being configured for maximum pre-driver strength. This latter arrangement can provide a form of fine-tuning by enabling some blending at the transmitter output between corrected and uncorrected unit cells.

In various embodiments, the tail transistors may be of identical size (thermometer control code), they may be binary weighted (binary control code), or some combination/variation thereof.

Actuator Control

Figure 7A:
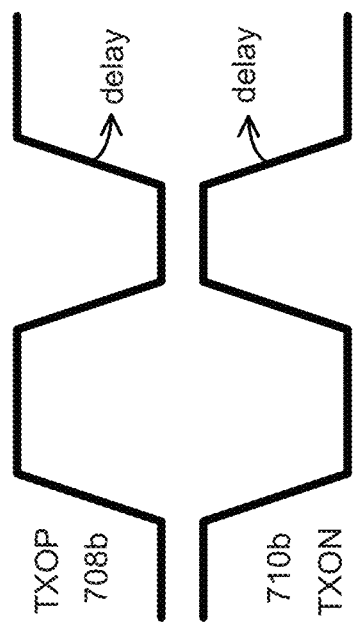
FIGS. 7A and 7B illustrate strategies for correcting single-ended DCD.

One approach to correct for data path single-ended duty cycle distortion (DCD), according to an example embodiment illustrated in FIG. 7A. FIG. 7A shows an example whereby both signal 708a and signal 710a exhibit single-ended duty cycle less than 50% (high' pulse width narrower than 'low' pulse width). To correct this single-ended DCD, the falling edges of both signal 708a and signal 710a are delayed. This strategy can be achieved by always maintaining VBP_PU=VBP_PD=VBP and VBN_PU=VBN_PD=VBN. To correct for this too-low duty cycle at the transmitter output ("1" pulses narrower than "0" pulses), VBN is left at a voltage corresponding to maximum pre-driver pull-down strength (i.e. VBN=vdd), and VBP is adjusted from a voltage corresponding to maximum pre-driver pull-up strength to one that corresponds to a weaker pre-driver pull-up strength (i.e. VBP=0 changed to VBP>0). This serves to delay the pre-driver output rising transitions, which serves to delay the transmitter output falling transitions and thus widen the "1" pulses at the transmitter output.

Figure 7B:
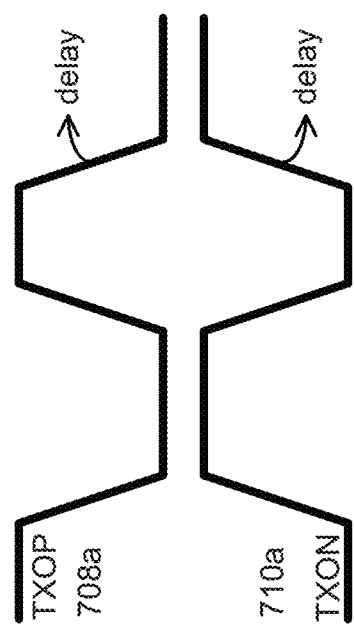

FIG. 7B shows the analogous situation whereby both signal 708b and signal 710b exhibit single-ended duty cycle greater than 50% (high' pulse width wider than 'low' pulse width). To correct this single-ended DCD, the rising edges of both signal 708b and signal 710b are delayed. To correct for this too-high duty cycle at the transmitter output ("0" pulses narrower than "1" pulses), a complementary operation to that discussed in relation to FIG. 7A is performed.

In another approach, according to another example embodiment, data path single-ended DCD is corrected for by leaving one set of (VBP_PU and VBN_PU) or (VBP_PD and VBN_PD) at their maximum-strength settings and adjusting the other set to a reduced-strength setting. To correct for a too-low duty cycle at the transmitter output ("1" pulses narrower than "0" pulses), VBP_PU and VBN_PU are left at maximum strength (0 and vdd, respectively), while VBP_PD and VBN_PD are both set to non-maximum settings (VBP_PD>0, VBN_PD<vdd). This serves to delay the entire waveform at the output of the pull-down path pre-driver with respect to the pull-up path pre-driver. Since the pull-down path (via the NMOS output driver device) primarily affects the locations of falling transitions at the transmitter output, this operation serves to adjust the location of falling transitions at the transmitter output, and thus widen the "1" pulses at the transmitter output. To correct for a too-high duty cycle at the transmitter output ("0" pulses narrower than "1" pulses), a complementary operation is performed.

Assembly of Unit Cells

At the composite transmitter level, it can be configured such that all unit cells in the transmitter employ a single-ended DCD correction approach (either the two previously discussed, or some other equivalent approach) simultaneously. It can also be configured such that a subset of the K total unit cells have single-ended DCD correction applied, with the remainder being configured for maximum pre-driver strength. This latter arrangement can provide an additional form of fine-tuning by enabling some blending at the transmitter output between corrected and uncorrected unit cells.

Illustration of Actuator Correction

Figure 8A:
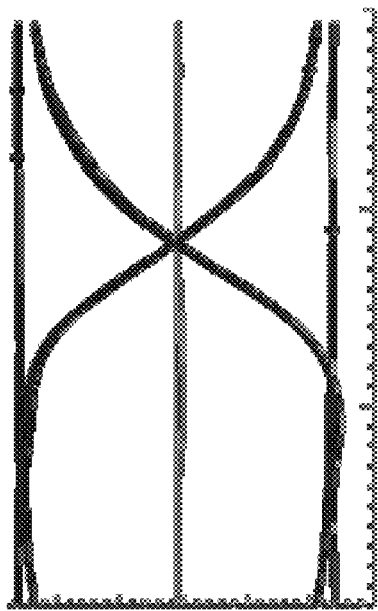
FIG. 8A illustrates an eye diagram of the transmitter, before correction, with the common-mode waveform superimposed.
Figure 8B:
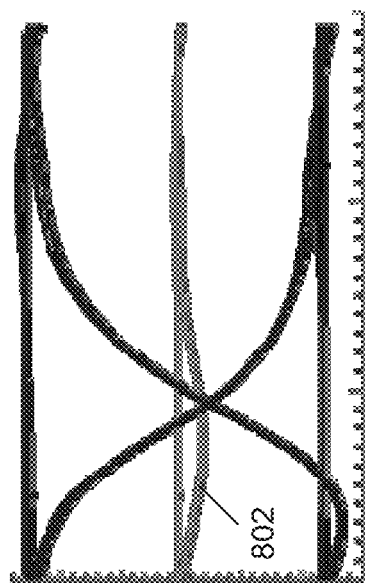
FIG. 8B illustrates the simulated eye diagram with superimposed common-mode waveform of the same transmitter after single-ended DCD correction is applied as per an embodiment of the present disclosure.
Figure 8C:
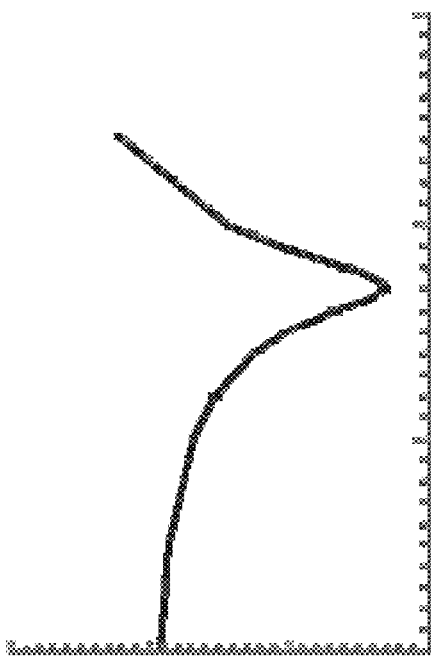
FIG. 8C illustrates EMI (y-axis; dB scale) versus amount of correction (x-axis; DAC code)

An illustration via simulation of the corrective capability of an example embodiment of the present disclosure is shown in FIGS. 8A-8C. In the simulation, the process condition is set at fast-PMOS, slow-NMOS to distort the amount of single-ended DCD for the purposes of illustration. FIG. 8A shows the single-ended eye diagram of the transmitter, before correction, with the common-mode waveform superimposed. Single-ended DCD is clearly evident, as "1" pulses are narrower than "0" pulses. The negative-going common-mode spurs 802 are an indication that falling edges are occurring relatively earlier than rising edges.

FIG. 8B shows the simulated eye diagram with superimposed common-mode waveform of the same transmitter after single-ended DCD correction is applied as per an embodiment of the present disclosure. Increasing amounts of single-ended DCD correction (applied by stepping through progressive codes of a DAC to control VBP_PD and VBN_PD voltages as per FIG. 5) was applied to delay falling edge transitions until a minimum in EMI (in dB) was obtained, as illustrated in FIG. 8C. FIG. 8C illustrates the amount of correction as per an embodiment of the present invention.

Alternative Actuator Control Strategy

The approaches mentioned thus far in this section to correct data path single-ended DCD have focused on determining the relative location of rising and falling transitions at the transmitter output, and then delaying the transitions that occur earlier to match up with the transitions that occur later. Delaying was achieved by decreasing the strength of a pre-driver (slow either the rise or the fall time, or both). It is equally possible, however, to organize and operate the pre-drivers such that their strength (rise or fall time or both) could also be increased to permit advancing transitions that occur relatively later to match up with transitions that occur relatively earlier.

Closed-Loop Data Path Single-Ended DCD Correction

Figure 9:
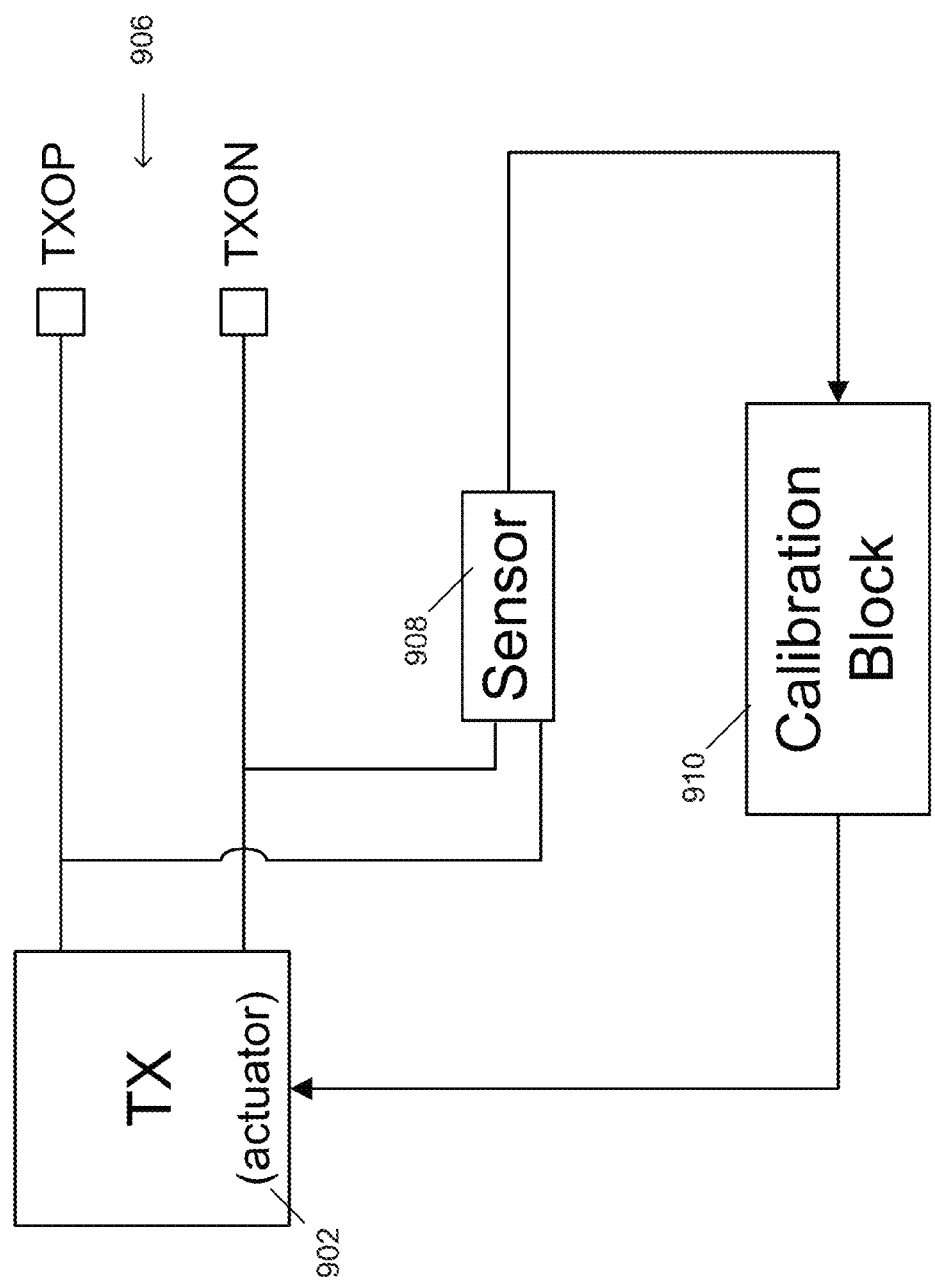
FIG. 9 illustrates a generic closed-loop calibration procedure for single-ended DCD reduction.

A closed-loop procedure by which the data path single-ended DCD at transmitter output can be reduced has a number of components. A closed-loop procedure according to an embodiment is shown in the block diagram of FIG. 9. FIG. 9 illustrates a system including an actuator 902 used to adjust the location of rising or falling transitions at the transmitter output 906 (TXOP and TXON), a sensor 908 to directly or indirectly measure the degree of single-ended DCD at the transmitter output 906, and a calibration block 910 that determines a corrective input stimulus for the actuator.

Actuator

The actuator has been defined earlier in the disclosure. The ability to adjust the strength of the pre-drivers that drive the output driver achieves the required functionality.

Sensor

One approach to implementation of the sensor is to employ direct sampling of the common mode waveform (without any RC filtering) to directly sense the peak to peak excursions from the settled common-mode. This may be challenging to implement in a practical application given that the frequency of the content of interest on the common-mode signal is at twice the rate of the data being transmitted.

Alternatively, the sensor may generally be comprised of one or multiple averaging and comparing mechanisms, operating on the output(s) of the transmitter. The averaging mechanism may be analog (e.g. an RC filter) or a mix of analog and digital elements. The comparison mechanism may involve one or more analog comparators which takes the analog output of the sensor and compares it against a reference voltage ($V_{REF}$).

Figure 10:
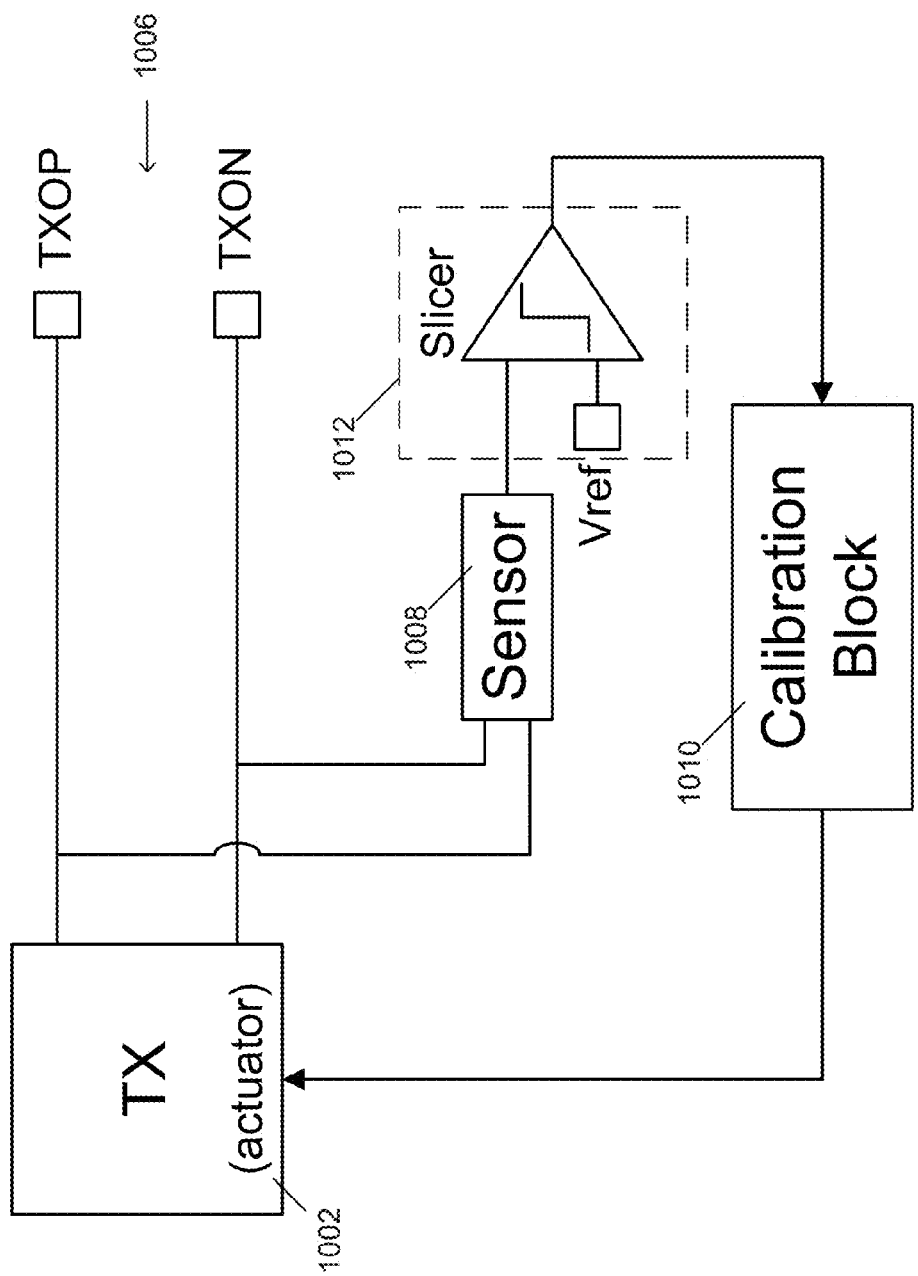
FIG. 10 illustrates a closed-loop calibration procedure with digitizing slicer.

Alternatively, there may be a digitizing block such as a slicer, which takes the analog comparator output and applies a threshold function to convert the information to a standard digital logic circuitry "1" or "0" (e.g. a comparator followed by a limiting amplifier and a flip-flop). FIG. 10 illustrates an embodiment of the closed-loop calibration procedure that employs a digitizing slicer that interfaces with a digital calibration state machine. FIG. 10 illustrates a system including an actuator 1002 used to adjust the location of rising or falling transitions at the transmitter output 1006 (TXOP and TXON), a sensor 1008 to directly or indirectly measure the degree of single-ended DCD at the transmitter output 1006, a comparison block 1012, and a calibration block 1010 that determines a corrective input stimulus for the actuator.

In some embodiments, the comparison block 1012 comprises a slicer, which includes a comparator that amplifies the signal difference on its input, and a limiting amplifier (e.g. a clocked sense-amplifier with regenerative feedback followed by a flip-flop) produces a digital signal that indicates whether the averaged signal level is greater or smaller than the reference voltage.

The natural comparator reference voltage for a voltage mode transmitter is a fraction of the supply voltage VDD (VDD/2, for example, when PMOS and NMOS paths have balanced path resistances). The reference voltage may be set to a potential other than the natural reference voltage depending on the objective, the specific closed loop correction algorithm, and various impairments that need to be compensated for. For example, it may be necessary to correct for random offset voltage on the comparator input or for leakage currents. The effect of process, voltage, and temperature on the PMOS and NMOS devices in the output driver may impact the common mode level. An alternate reference voltage level (from a replica circuit, for example) or a programmable reference voltage (from a DAC, for example) may be employed to generate the reference voltage.

Figure 11:
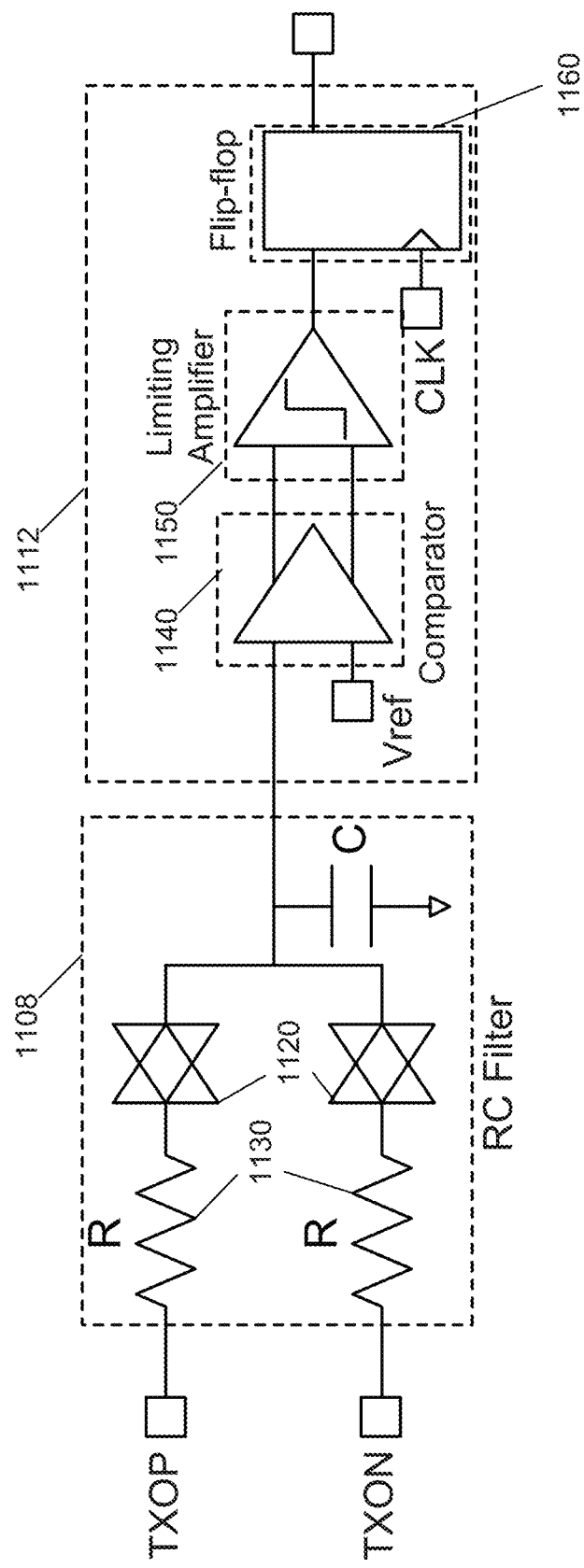
FIG. 11 illustrates a representative sensor/slicer for closed-loop calibration.

FIG. 11 illustrates a representative sensor and comparison block of an embodiment of the present disclosure. In the embodiment of FIG. 11, the sensor 1108 is implemented as a programmable RC filter that can select the transmitter output signal on which to perform filtering (via an analog switch implemented as a pair of transmission gates 1120). The resistive network 1130 is used to sense the average value of the selected transmitter output. The comparison block 1112 is implemented as a slicer. The slicer comprises a comparator 1140 followed by a limiting amplifier 1150 and a flip-flop 1160. This sensing/slicing approach is useful for general applications, but also specifically when only one output of the transmitter is to be used in a particular application. The calibration loop may then preferentially select that transmitter output upon which to sense and slice.

Figure 12:
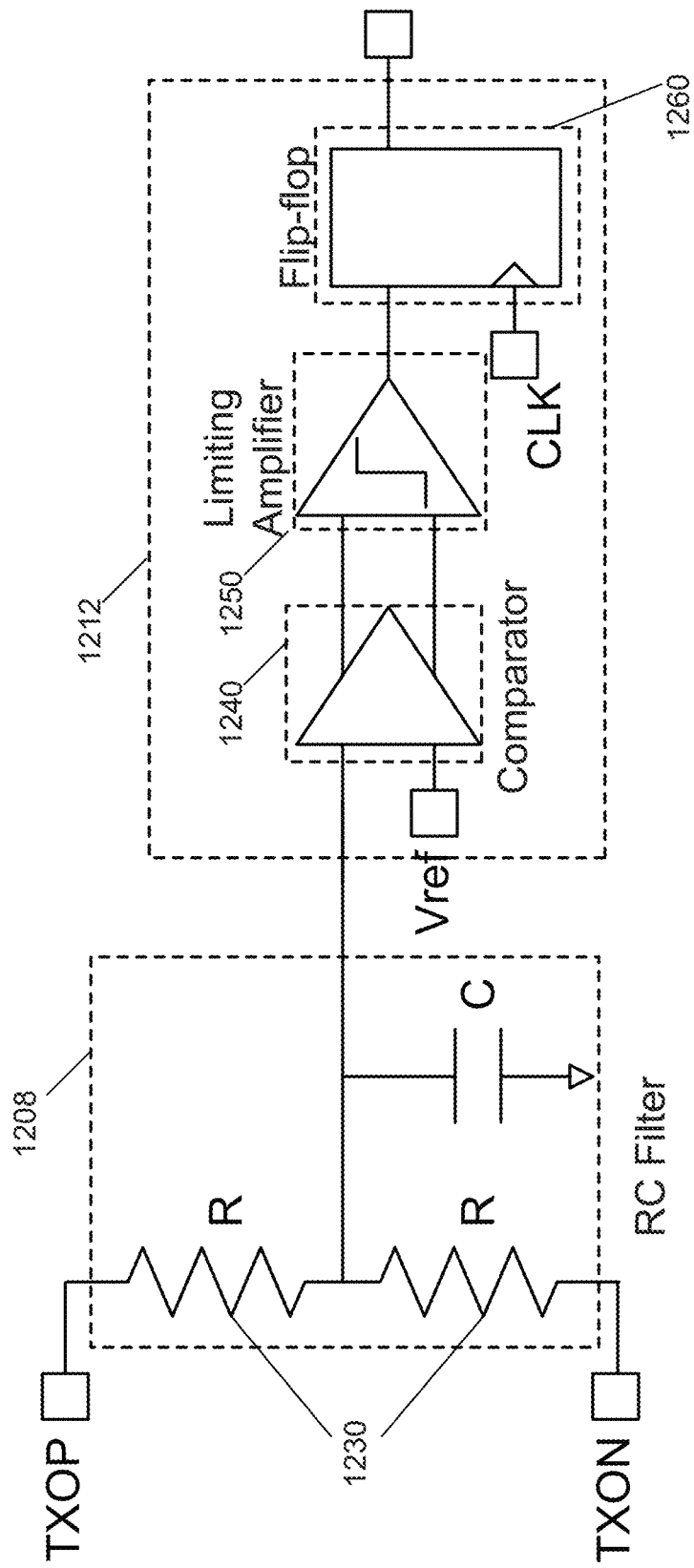
FIG. 12 illustrates another representative sensor/slicer for closed-loop calibration.

FIG. 12 illustrates another representative sensor and slicer according to an embodiment of the present disclosure. In this embodiment, the sensor 1208 is implemented as an RC filter, where the resistive network 1230 is used to sense the common-mode of the transmitter output. The comparison block 1212 is implemented as a slicer. The slicer comprises a comparator 1240 followed by a limiting amplifier 1250 and a flip-flop 1260. This sensing/slicing approach is useful for general differential signaling applications. Note that the sensor/slicer representation of FIG. 12 is essentially an alternate configuration of the sensor/slicer of FIG. 12 in which the two transmission gates are simultaneously enabled.

Calibration Block

This digitized signal from the output of the slicer becomes the input to the calibration block. In various embodiments, the calibration block includes a clocked digital block that performs digital filtering on the input and devises an appropriate control signal change for the actuator that serves to reduce the detected data path single-ended DCD. The digital filtering (e.g. based on a digital counter/accumulator) serves to average out the effects of noise in the measurement and produce a more stable closed loop operation. When a sufficient number of like events indicating a "1" pulse width>than "0" pulse width scenario (or vice versa) have accumulated, an incremental adjustment is made to pre-drivers in one or more unit cells such that the single-ended DCD is diminished.

Calibration Strategy

Advantageous or optimal approaches to performing a calibration operation to reduce data path single-ended DCD (and improve EMI) would be to avoid the use of external (off-chip) components, and to perform the calibration operation at system power-up and/or periodically in scheduled downtime intervals in what otherwise would be normal transmitter operation, or in the background during normal operation.

Given that the sensor typically performs an averaging operation on the transmitter output, any non-static pattern output by the transmitter during calibration would ideally be DC-balanced (i.e. an equal number of 1's and 0's over a sufficiently large window of time during which calibration is to be performed). If the pattern is not DC-balanced, then the sensor can report erroneous results to the slicer and calibration state machine unless the reference voltage is adjusted commensurately with knowledge of the drift in expected long-term average value. The use of a static 1 or 0 as the transmitted signal is not appropriate for this calibration, as it will not sensitize the mismatches in data path that give rise to single-ended DCD.

One potential disadvantage in performing closed-loop calibration is that the sensor cannot distinguish between mismatch sources in the output driver, the pre-driver, and any other circuitry that precedes the pre-driver. In this case, the effect of the overall calibration loop will serve to minimize the total error from all sources. To achieve better results, separate calibration operations may be performed to try to isolate and correct impairments originating from specific sources. For example, rise and fall time mismatch at the output of the transmitter will appear to the sensor as single-ended DCD. If the output rise and fall times of the transmitter could be corrected (through adjustment of output driver characteristics, for example), then the closed-loop calibration of the present disclosure could more optimally correct for single-ended DCD originating from sources in the data path prior to the output driver.

Given the generic controllability of the pre-drivers in the unit cell of embodiments of the present disclosure, such as that illustrated in, for example, FIG. 6, there are additional functions that may be leveraged.

Figures 13A, 13B:
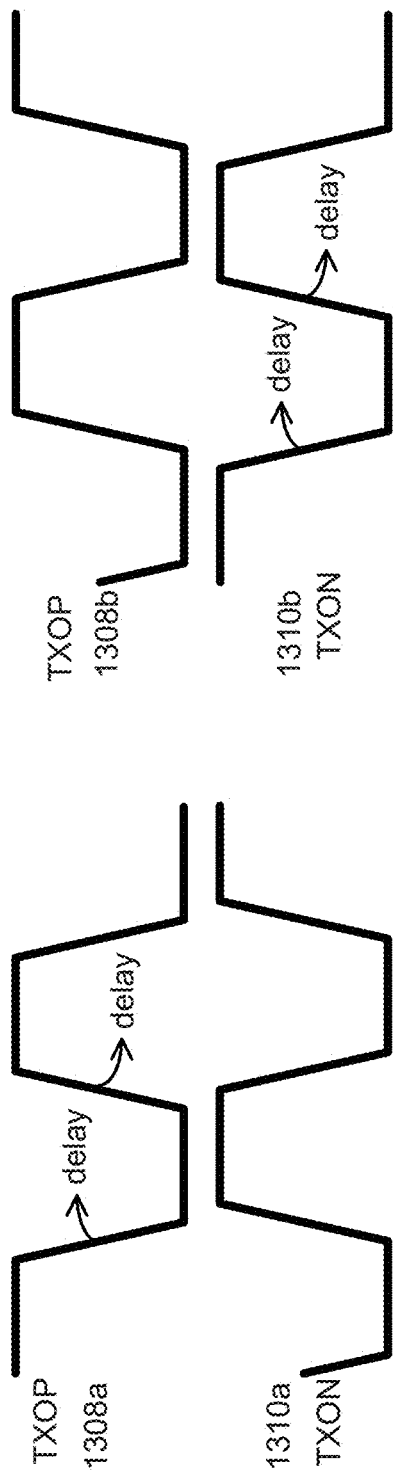
FIGS. 13A and 13B illustrate strategies for correcting polarity skew.

One example is polarity skew control for a differential transmitter. With a unit cell structure as shown in FIG. 6 for each polarity of the transmitter, one can achieve polarity skew adjustment by decreasing the strength of all pre-drivers in a unit cell corresponding to one of the polarities (the one to be delayed with respect to the other). FIGS. 13A and 13B illustrate this strategy. FIG. 13A illustrates the positive signal 1308a (TXOP) leading negative signal 1310a (TXON). In this situation, the positive signal 1308a can be delayed in order to eliminate the skew. FIG. 13B illustrates the negative signal 1310b leading the positive signal 1308b. In this situation, the negative signal 1310b can be delayed in order to eliminate the skew. Alternatively, in various embodiments, if the unit cell is implemented in the appropriate manner, it is possible to both delay the early polarity and advance the late polarity. In yet other embodiments, the lagging signal is advanced while the leading polarity is left alone.

Another example is a scenario in which information on the process (P) and the operating voltage (V) and temperature (T) are available during normal operation of the transmitter. In a particular PVT condition, transition times might be faster than necessary to support the target data rate for the application. It is possible in such a case to decrease the strength of the pre-drivers in all unit cells of the composite transmitter, reducing power consumption.

Various embodiments of the present disclosure have been described in this document. Although this disclosure has been described with reference to these specific embodiments, the descriptions are intended to be illustrative of the disclosure and are not intended to be limiting. Various modifications and applications may occur to those familiar with the subject without departing from the true spirit and scope of the disclosure.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

What is claimed is:

1. A circuit for correcting single-ended duty cycle distortion (DCD) in an output signal of a transmitter, the circuit comprising:
    a plurality of unit cells, each unit cell comprising:
        an output driver stage having an input, an output, a positive polarity output driver and a negative polarity output driver;
        a pre-driver coupled to the input of the output driver stage, the pre-driver configured and adapted to provide an adjustable pull up drive strength and an adjustable pull down drive strength when driving the output driver stage input to adjust a timing of one of a rising edge or a falling edge of the output driver stage, the pre-driver comprising a positive polarity pre-driver coupled to the positive polarity output driver and a negative polarity pre-driver coupled to the negative polarity output driver, wherein each of the positive and negative polarity pre-drivers comprises:
            a first current starved inverter coupled to a pull-up path of its respective polarity output driver; and
            a second current starved inverter coupled to a pull-down path of its respective polarity output driver, where each of the first and second current starved inverters comprises first and second bias voltage inputs for controlling the current supply to its respective current starved inverter to affect the pull up strength or pull down strength of the each of the pre-drivers,
    wherein the outputs of the positive polarity output drivers are coupled together and the outputs of the negative polarity output drivers are coupled together, the coupled together positive polarity output drivers and coupled together negative polarity output driver providing the output signal;
    a sensing block configured to sense single-ended DCD in the output signal of the transmitter; and
    a calibration block configured to provide control signals to the plurality of unit cells based on the sensed single-ended DCD of the output signal, the calibration block being further configured to fine-tune the output signal of the transmitter by independently adjusting the pull up strength or the pull down strengths of the pre-drivers of each unit cell to achieve a blended output signal.

2. The circuit of claim 1, wherein the calibration block is configured to:
control a first subset of the unit cells for single-ended DCD correction; and
control a second subset of the unit cells for maximum pre-driver strength.

3. The circuit of claim 1, wherein the calibration block is configured to fine-tune the output of the circuit by independently controlling each unit cell to achieve a desired blended output.

4. The circuit of claim 1, further comprising a comparison block configured to:
generate a digitized signal based on the sensed single-ended DCD of the output signal; and
provide the digitized signal to the calibration block.

5. The circuit of claim 1, wherein the sensing block comprises an RC filter.

6. The circuit of claim 1, wherein the sensing block comprises:
a plurality of different types of sensors; and
at least one switch for selecting between the plurality of different types of sensors.

7. The circuit of claim 1, wherein the timing adjustment of the pre-driver is a delay of one of the rising edge and the falling edge of the output signal.

8. The circuit of claim 1, wherein the timing adjustment of the pre-driver is an advance of one of the rising edge and the falling edge of the output signal.

9. The circuit of claim 1, wherein the output signal is a differential signal having a positive polarity and a negative polarity; and wherein the sensing block is configured to sense an average of one of the positive and negative polarities.

10. The circuit of claim 1, wherein the output signal is a differential signal having a positive polarity and a negative polarity; and wherein the sensing block is configured to sense a common mode of output signal.

11. The circuit of claim 1, wherein the pre-driver of at least one of the plurality of unit cells comprises a plurality of current starved inverters coupled in parallel.

12. The circuit of claim 2, wherein the calibration block is configured to controllably change the assignment of a unit cell to the first or second subset.

13. The circuit of claim 4, wherein the comparison block comprises:
a comparator;
a limiting amplifier; and
a flip-flop.

14. A circuit for correcting single-ended duty cycle distortion (DCD) of a transmitter, the circuit comprising:
an actuator block configured to adjust an output signal of the transmitter, the actuator block comprising:
an output driver stage, wherein the output driver stage comprises a positive polarity output driver and a negative polarity output driver; and
a pre-driver coupled to an input of the output driver stage, the pre-driver configured and adapted to provide an adjustable pull up drive strength and an adjustable pull down drive strength when driving the output driver stage input to adjust a timing of one of a rising edge or a falling edge of the output driver stage, wherein the pre-driver comprises a positive polarity pre-driver coupled to the positive polarity output driver and a negative polarity pre-driver coupled to the negative polarity output driver; and wherein each of the positive and negative polarity pre-drivers comprises:
a first current starved inverter coupled to a pull-up path of its respective polarity output driver; and
a second current starved inverter coupled to a pull-down path of its respective polarity output driver, where each of the first and second current starved inverters comprises first and second bias voltage inputs for controlling the current supply to its respective current starved inverter to affect the pull up strength or pull down strength of the each of the pre-drivers;
a sensing block configured to sense single-ended DCD in the output signal of the transmitter; and
a calibration block configured to provide a control signal to the actuator block based on the sensed single-ended DCD of the output signal for adjusting the pull up strength or the pull down strength of the pre-driver.

15. The circuit of claim 14, wherein at least one of the positive polarity pre-driver and the negative polarity pre-driver comprises a plurality of current starved inverters coupled in parallel.

16. The circuit of claim 14, wherein the timing adjustment comprises a delay of one of the rising edge and the falling edge of the output signal.

17. The circuit of claim 14, wherein the timing adjustment comprises an advance of one of the rising edge and the falling edge of the output signal.

18. The circuit of claim 14, wherein the sensing block comprises an RC filter.

* * * * *